(12) United States Patent
Iwabuchi et al.

(10) Patent No.: US 7,550,945 B2
(45) Date of Patent: Jun. 23, 2009

(54) VOLTAGE MEASUREMENT DEVICE

(75) Inventors: Akio Iwabuchi, Niiza (JP); Kazuya Aizawa, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 405 days.

(21) Appl. No.: 11/243,164

(22) Filed: Oct. 5, 2005

(65) Prior Publication Data

US 2006/0087329 A1   Apr. 27, 2006

(30) Foreign Application Priority Data

Oct. 6, 2004   (JP)   ............... 2004-293932

(51) Int. Cl.
*H02J 7/00* (2006.01)
*G01R 27/26* (2006.01)

(52) U.S. Cl. .................. 320/116; 320/134; 324/678

(58) Field of Classification Search ............... 320/116, 320/134; 324/678
See application file for complete search history.

(56) References Cited

U.S. PATENT DOCUMENTS

| | | | |
|---|---|---|---|
| 2004/0051534 A1* | 3/2004 | Kobayashi et al. | 324/429 |
| 2005/0225290 A1* | 10/2005 | Hashimoto et al. | 320/116 |
| 2006/0186894 A1* | 8/2006 | Iwabuchi et al. | 324/607 |

FOREIGN PATENT DOCUMENTS

| | | |
|---|---|---|
| JP | 59-198361 | 11/1984 |
| JP | 2001-255342 | 9/2001 |
| JP | 2002-315212 | 10/2002 |
| JP | 2004-085208 | 3/2004 |
| JP | 2004-245743 | 9/2004 |
| WO | WO 2004/086065 A1 | 10/2004 |

* cited by examiner

*Primary Examiner*—Edward Tso
*Assistant Examiner*—Alexis Boateng
(74) *Attorney, Agent, or Firm*—Oblon, Spivak, McClelland, Maier & Neustadt, P.C.

(57) ABSTRACT

A voltage measurement device includes: a charging circuit 100 having a first switch group of semiconductor elements P1, P2 for connecting voltages of respective blocks, into which a plurality of voltage sources $V_{Cn}$ are divided, to a charging condenser $C_n$ and a second switch groups of semiconductor elements N3, N4 for connecting the voltage of each block accumulated in the charging condenser $C_n$ to an output terminal; an A/D converter 120 connected to an output terminal of the charging circuit 100; and a CPU 130 measuring a stray capacitance including a parasitic capacitance of the semiconductor element N4 in advance and further calculates an error voltage due to electrical charges accumulated in the parasitic capacitance. The CPU 130 further calculates a true value of the voltage of each block by subtracting the error voltage from a measured value of terminal voltage at the output terminal of the charging circuit 100.

5 Claims, 11 Drawing Sheets

US 7,550,945 B2

VOLTAGE MEASUREMENT DEVICE

BACKGROUND OF THE INVENTION

The present invention relates to a voltage measurement device that allows measuring capacity elements to accumulate terminal voltages for every block of a plurality of voltage sources (hundreds of storage batteries, fuel batteries, etc.) connected in series, through a first group of switches (semiconductor elements), thereby measuring accumulated voltages in the capacity elements through a second group of switches (semiconductor elements). More particularly, the invention relates to a calculating circuit for correcting errors of measured voltages due to parasitic capacitances inhering in the semiconductor elements forming the second group of switches.

From a viewpoint of environmental protection, there are known an electric car having a motor as a driving source for traveling the car and a hybrid vehicle having a motor and an engine as the driving source. It's often the case that hundreds of storage batteries or fuel batteries (which will be generally referred "batteries" below) connected in series are used for a power source for driving these motors. Recently, the need to measure terminal voltages of respective battery cells with high accuracy, which are connected in series and to which hundreds of voltage is impressed each, is increasing for purpose of monitoring the ever-changing charging state of the batteries during vehicle's traveling, the ever-changing discharging state, life-time of respective batteries, the presence of a malfunction and so on.

FIG. 1 shows a conventional voltage measurement system for measuring terminal voltages of such batteries with the use of charging/discharging of condensers.

The voltage measurement system in the figure comprises a voltage measuring part 2 connected to a battery 1, a voltage converting part 3 connected to an output side of the voltage measuring part 2 and a control part (not shown) for controlling the switching (ON/OFF) operation of the voltage measuring part 2 based on an output of the voltage converting part 3.

The battery 1 is composed of n (n: integral number more than 1) blocks connected in series (shown with only blocks N−1, N and N+1 in the figure). In each of the blocks, there are a plurality of battery cells connected in series, respectively forming voltage sources to be measured (shown with only voltage sources $V_{Cn-1}$, $V_{Cn}$, $V_{Cn+1}$ respectively corresponding to the blocks N−1, N and N+1 in the figure). This battery 1 outputs a high voltage, for example, 100 to 200 V.

The voltage measuring part 2 is composed of n voltage measurement circuits arranged for every block of the battery 1. The voltage measurement circuits include a first group of switches (switches P1, P2 corresponding to the block N in the shown example), condensers as the measuring capacity elements (illustrated by only condensers $C_{n-1}$, $C_n$, $C_{n+1}$ corresponding to the blocks N−1, N and N+1 in the shown example) and a second group of switches (switches N3, N4 corresponding to the block N in the shown example). Receiving a control signal from the control part, each voltage measurement circuit takes in a voltage from each block of the battery 1 through the first group of switches and holds the voltage in the corresponding condenser. Then, corresponding to a control signal from the control part, each voltage measurement circuit transmits the voltage held in the condenser to the voltage converting part 3 through the second group of switches.

The voltage converting part 3 is composed of, for example, an A/D converter. The voltage converting part 3 converts a voltage in the form of an analogue signal supplied from the voltage measuring part 2 to a digital signal and further transmits it to the control part.

The control part (not shown) supplies the voltage measuring part 2 with the control signals to control the operation of the part 2. In addition, the control part adds the digital signals transmitted from the voltage converting part 3 to calculate an overall voltage of the battery 1 and a voltage with respect to each block. The so-calculated voltages are used to monitor the charging state of the battery 1, the discharging state of the battery 1, a lifetime of the battery, the presence of malfunction, etc.

The voltage measurement system constructed above is adapted so as to measure the terminal voltages of the respective batteries (blocks) by first charging each terminal voltage of the plural batteries $V_{Cn-1}$, $V_{Cn}$, $V_{Cn+1}$ in series connection into the corresponding storage element (condenser) $C_{n-1}$, $C_n$, or $C_{n+1}$ through the switches P1, P2 in the first group SW1, secondly turning off them and subsequently connecting the storage element (condensers) $C_{n-1}$, $C_n$ or $C_{n+1}$ with the voltage measuring unit (voltage converting part) V through the switches N3, N4 in the second group SW2.

The voltage measurement device, disclosed by Japanese Patent Application No. 2003-80406, utilizes the voltage measurement system like this. This related art has an object to provide a voltage measurement device which can measure terminal voltages of batteries quickly and accurately without an exclusive power source and which is compact at low price while being superior in noise resistance. For this purpose, the switches P1, P2 in the first group SW1 for controlling the charging operation are formed by Pch-MOSFETS (Metal-Oxide Semiconductor Field-Effect Transistors), while the switches N3, N4 in the second group SW2 for controlling the output operation are formed by Nch-MOSFETS (Metal-Oxide Semiconductor Field-Effect Transistors). With this constitution, the voltage measurement device is capable of measuring voltages of the batteries by first turning on the Pch-MOSFETS P1, P2 in the first group SW1 to charge a voltage from the battery $V_{Cn}$ into an external condenser $C_n$, secondly turning off the Pch-MOSFETS P1, P2 in the first group SW1 and subsequently turning on the Nch-MOSFETS N3, N4 in the second group SW2 to output the voltage at an output terminal (S-terminal).

SUMMARY OF THE INVENTION

In the voltage measurement device of the related art, it is required to measure voltages ranging from 0 to dozens of voltages quickly and accurately. However, since the measuring accuracy is further lowered in some batteries on the high voltage side (especially, a small voltage less than 1V) of all the batteries in series connection due to parasitic capacitances inhering in semiconductor elements forming the voltage measuring circuits, the conventional technique mentioned above has a problem that data of great precision cannot be provided.

As one measure against such a problem, it is believed to increase the capacities of the condensers $C_n$, thereby reducing errors in measured voltages. Here, if increasing the capacities of the condensers, then the difference in electrical charges between the capacity of each condenser $C_n$ and the parasitic capacitance of each semiconductor element becomes larger to reduce a difference between the measured voltage and a true voltage. However, as the above measure requires more expensive and larger volumetric condensers, the whole circuit becomes more expensive. Additionally, since the measure is accompanied with extended charging time for the condensers, it is difficult to provide the terminal voltages with the speedy measurement disadvantageously.

In the above-mentioned situation, it is an object of the present invention to reduce a measuring error caused by the stray capacitances inhering in semiconductor elements forming a voltage measurement circuit without expensive large-capacious condensers and to accomplish further speeding-up in measuring a voltage of each block forming the battery.

In the first aspect of the present invention, there is provided a voltage measurement device, in a battery where a plurality of voltage sources in series connection are divided into a plurality of blocks each having at least one voltage source, for measuring respective voltages of the blocks, the voltage measurement device comprising: a measuring capacitive element connected to the blocks; a first group of switches each arranged between the blocks and the measuring capacitive element to connect the voltages of the blocks to the measuring capacitive element; a measuring output terminal connected to the measuring capacitive element; a second group of switches each arranged between the measuring capacitive element and the measuring output terminal to connect the voltage of the blocks accumulated in the measuring capacitive element to the measuring output terminal; and calculating means connected to the measuring output terminal and adapted so as to perform the operations of: measuring a stray capacitance including parasitic capacitances of the second group of switches in advance; calculating an erroneous voltage due to electrical charges accumulated in the stray capacitance; and subtracting a calculated value of the erroneous voltage from a measured value of a terminal voltage of the measuring output terminal, thereby calculating a true value of a measured voltage of each of the blocks.

In the second aspect of the invention, there is also provided a voltage measurement device, in a battery where a plurality of voltage sources in series connection are divided into a plurality of blocks each having at least one voltage source, for measuring respective voltages of the blocks, the voltage measurement device comprising: a measuring capacitive element connected to the blocks; a first group of switches each arranged between the blocks and the measuring capacitive element to connect the voltages of the blocks to the measuring capacitive element; a measuring output terminal connected to the measuring capacitive element; a second group of switches each arranged between the measuring capacitive element and the measuring output terminal to connect the voltage of the blocks accumulated in the measuring capacitive element to the measuring output terminal; calculating means connected to the measuring output terminal; and storing means connected to the calculating means, wherein the calculating means is adapted so as to perform the operations of: measuring known voltages of the blocks thereby calculating an erroneous voltage due to electrical charges accumulated in a stray capacitance including parasitic capacitances of the second group of switches; calculating stray capacitances of the blocks by a calculated value of the erroneous voltage; allowing the storing means to store calculated values of the stray capacitances of the blocks; reading out the calculated values of the stray capacitances from the storing means when measuring each voltage of the blocks, thereby calculating the erroneous voltage; and subtracting a calculated value of the erroneous voltage from a measured value of a terminal voltage of the measuring output terminal, thereby calculating a true value of a measured voltage of each of the blocks.

In the third aspect of the invention, there is also provided a voltage measurement device, in a battery where a plurality of voltage sources in series connection are divided into a plurality of blocks each having at least one voltage source, for measuring respective voltages of the blocks, the voltage measurement device comprising: a measuring capacitive element connected to the blocks; a first group of switches each arranged between the blocks and the measuring capacitive element to connect the voltages of the blocks to the measuring capacitive element; a measuring output terminal connected to the measuring capacitive element; a second group of switches each arranged between the measuring capacitive element and the measuring output terminal to connect the voltage of the blocks accumulated in the measuring capacitive element to the measuring output terminal; calculating means connected to the measuring output terminal; and storing means connected to the calculating means, wherein the calculating means is adapted so as to perform the operations of: measuring known voltages of the blocks thereby calculating an erroneous voltage due to electrical charges accumulated in a stray capacitance including parasitic capacitances of the second group of switches; allowing the storing means to store a calculated value of the erroneous voltage; subtracting the calculated value of the erroneous voltage stored in the storing means from a measured value of a terminal voltage of the measuring output terminal when measuring each voltage of the blocks, thereby calculating a true value of a measured voltage of each of the blocks.

BRIEF DESCRIPTION OF THE DRAWINGS

FIG. 11A is a graph showing the measuring results of battery voltages, while

DETAILED DESCRIPTION OF THE PREFERRED EMBODIMENT

Referring to accompanying drawings, preferred embodiments of the present invention will be described below.

First, the measuring principle of a voltage measurement device of the invention will be described with reference to FIGS. 2 to 7. Note, in the invention, a terminology "stray capacitance" contains not only stray capacitance of a semiconductor element but wiring capacity. Still, only the stray capacitance of a semiconductor element will be described in the following descriptions.

Figure 1:
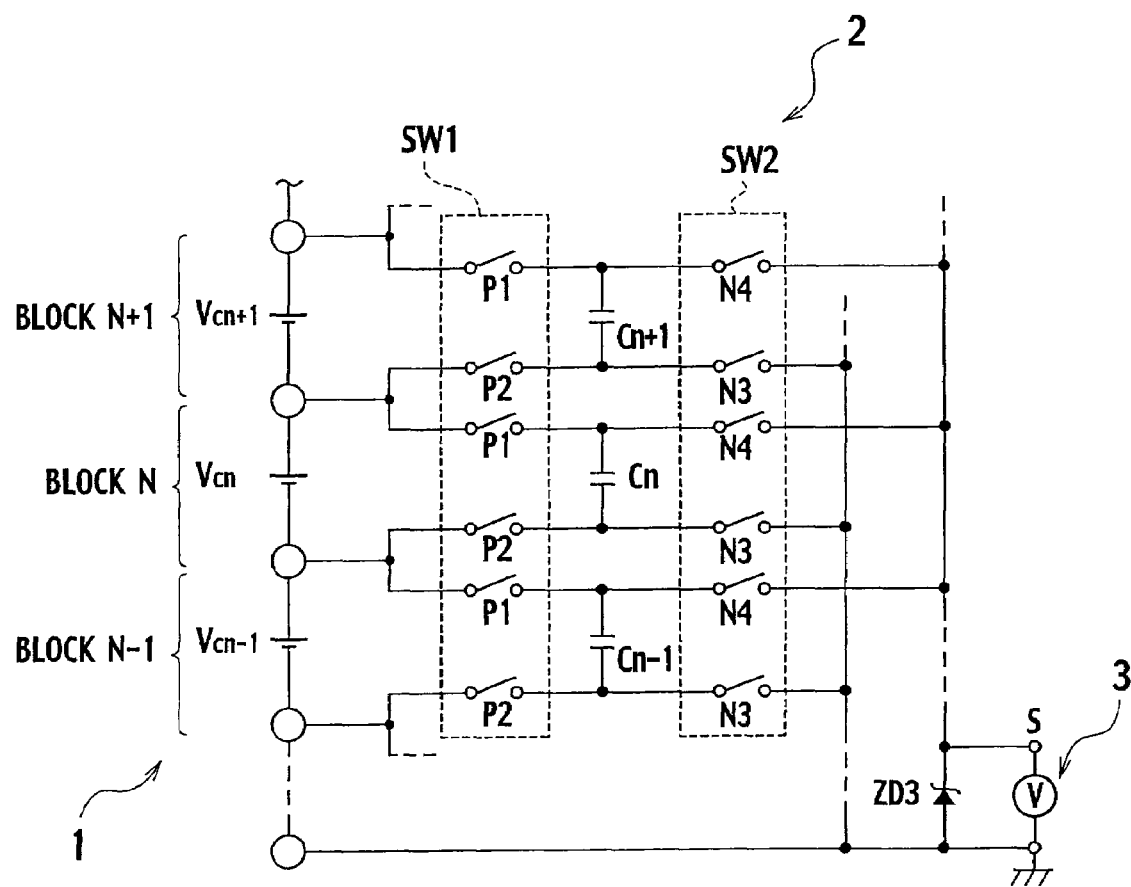
FIG. 1 is a schematic circuit diagram showing the whole structure of a related-art voltage measurement system for measuring terminal voltages of batteries with the use of charging/discharging condensers.
Figure 2:
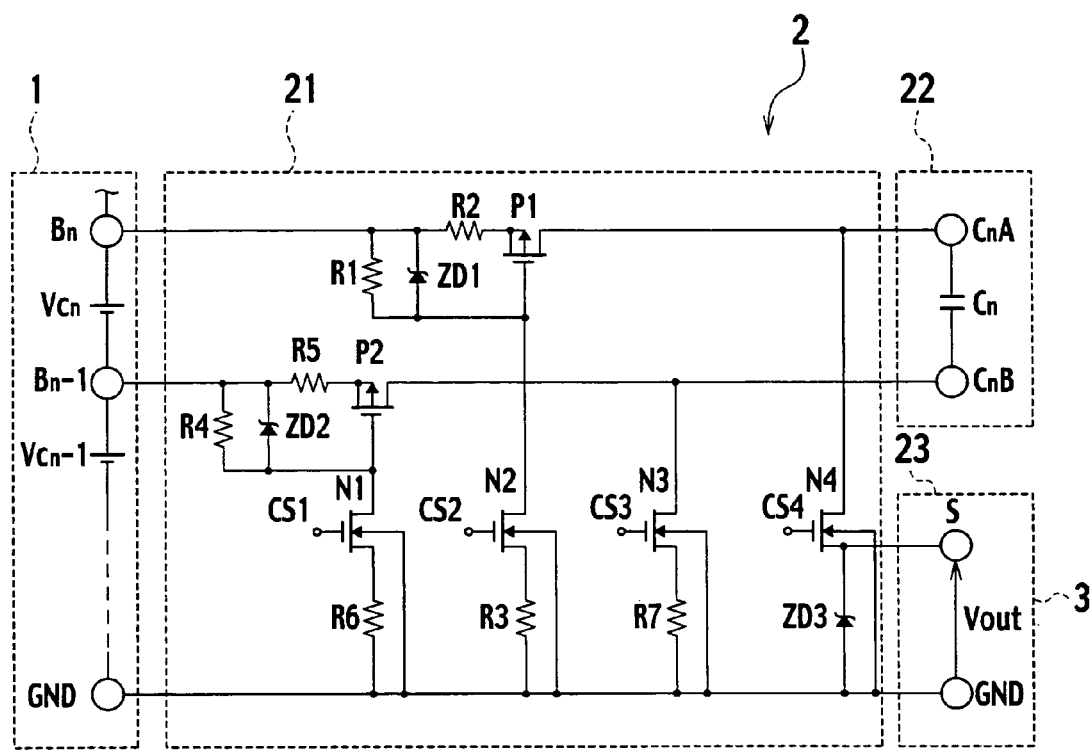
FIG. 2 is a schematic circuit diagram showing the whole structure of a voltage measurement device of the present invention, also explaining its measuring principle.

FIG. 2 is a circuit diagram obtained as a result of applying the present invention on the afore-mentioned voltage measurement device in the related art. In the voltage measurement device of FIG. 2, descriptions about constituents similar to those of the voltage measurement system of FIG. 1 will be simplified or eliminated.

In FIG. 2, the voltage measurement device includes a battery 1, a voltage measuring part 2, a voltage converting part 3 and a control part. In this illustrated example, the constitution of the voltage measuring part 2 corresponding to the voltage source $V_{cn}$ of the block N will be described below. Still, needless to say, the constitution of the voltage measuring part 2 corresponding to the other block is also identical to that corresponding to the voltage source $V_{cn}$.

In the constituents, the voltage measuring part 2 includes a voltage measurement circuit 21 containing the first to third groups of switches, a condenser circuit 22 having a charging condenser $C_n$ forming a measuring capacity element and two terminals $C_nA$, $C_nB$ on both sides of the condenser $C_n$ and an output terminal 23 having voltage output terminals S, GND.

The first group of switches includes a P-channel MOS field effect transistor (referred to as "Pch-MOSFET" hereinafter) P1 and a Pch-MOSFET P2. The second group of switches includes a N-channel MOS field effect transistor (referred to as "Nch-MOSFET" hereinafter) N3 and a Nch-MOSFET N4 both connected to the first group of switches through the condenser $C_n$. The third group of switches includes an Nch-MOSFET N2 and an Nch-MOSFET N1, which are connected to gates of the Pch-MOSFET P1 and the Pch-MOSFET P2, respectively. For these MOS field effect transistors (referred to as "MOSFETs" hereinafter) P1, P2, N1, N2, N3 and N4, high withstand-voltage elements capable of resisting a high voltage (e.g. 600V) are employed although it varies upon a voltage of the battery 1.

The first to third group of switches will be described below, in detail.

(1$^{st}$. Group of Switches)

The first group of switches connected to voltage input terminals $B_n$, $B_{n-1}$ on both sides of the voltage source $V_{Cn}$ are formed by the Pch-MOSFETs P1 and P2. The Pch-MOSFET P1 is connected to the voltage input terminal $B_n$ on one side of the voltage source $V_{Cn}$, while the Pch-MOSFET P2 is connected to the voltage input terminal $B_{n-1}$ on the other side of the voltage source $V_{Cn}$.

The Pch-MOSFET P1 has a source connected to the voltage input terminals $B_n$ of the voltage source $V_{Cn}$ through a resistance R2, a drain connected to one terminal $C_nA$ on one side of the condenser $C_n$, a gate connected to a drain of the Nch-MOSFET N2 and a backgate (substrate) connected to a source of the Pch-MOSFET P1. Between the backgate and the gate of the Pch-MOSFET P1, a zener diode ZD1 functioning as a limiter of the gate voltage and a resistance R1 are connected in parallel with each other in order to determine the gate voltage of the Pch-MOSFET P1. That is, in the zener diode ZD1, the cathode is connected to the backgate of the Pch-MOSFET P1, while the anode is connected to the gate of the Pch-MOSFET P1. Owing to the interposition of the resistance R2 and the zener diode ZD1, a current flowing in the Pch-MOSFET P1 is restricted to prevent its breakage.

The Pch-MOSFET P2 has a source connected to the voltage input terminal $B_{n-1}$ of the voltage source $V_{Cn}$ through a resistance R5, a drain connected to the other terminal $C_nB$ on the other side of the condenser $C_n$, a gate connected to a drain of the Nch-MOSFET N1 and a backgate connected to the voltage input terminal $B_{n-1}$ of the voltage source $V_{Cn}$ to be measured. Between the backgate and the gate of the Pch-MOSFET P2, a zener diode ZD2 functioning as a limiter of the gate voltage and a resistance R4 are connected in parallel with each other in order to determine the gate voltage of the Pch-MOSFET P2. That is, in the zener diode ZD2, the cathode is connected to the backgate of the Pch-MOSFET P2, while the anode is connected to the gate of the Pch-MOSFET P2. Owing to the interposition of the resistance R5 and the zener diode ZD2, a current flowing in the Pch-MOSFET P2 is restricted to prevent its breakage.

(3$^{rd}$. Group of Switches)

The Nch-MOSFET N1 is used to drive the Pch-MOSFET P2. As mentioned above, the Nch-MOSFET N1 has a drain connected to the gate of the Pch-MOSFET P2, a source connected to ground (GND) through a resistance R6 and a backgate (substrate) connected to the GND. By the resistance R6, a current flowing in the Nch-MOSFET N1 is restricted to prevent its breakage.

Further, the Nch-MOSFET N1 has a gate connected to a control-signal input terminal CS1. When a high level (H-level) of voltage from a control part (not shown) is impressed on the control-signal input terminal CS1, the Nch-MOSFET N1 is turned on. As a result, the Pch-MOSFET P2 is also turned on, so that a voltage from the voltage input terminal $B_{n-1}$ is impressed on the other terminal $C_nB$ of the charging condenser $C_n$.

The Nch-MOSFET N2 is used to drive the Pch-MOSFET P1. As mentioned above, the Nch-MOSFET N2 has a drain connected to the gate of the Pch-MOSFET P1, a source connected to ground (GND) through a resistance R3 and a backgate (substrate) connected to the GND. By the resistance R3, a current flowing in the Nch-MOSFET N2 is restricted to prevent its breakage.

Further, the Nch-MOSFET N2 has a gate connected to a control-signal input terminal CS2. When an H-level of voltage from the control part (not shown) is impressed on the control-signal input terminal CS2, the Nch-MOSFET N2 is turned on. As a result, the Pch-MOSFET P1 is also turned on, so that a voltage from the voltage input terminal $B_n$ is impressed on the terminal $C_nA$ of the charging condenser $C_n$.

(2$^{nd}$. Group of Switches)

The Nch-MOSFET N3 has a drain connected to one terminal $C_nB$ on the other side of the condenser $C_n$, a source connected to ground through a resistance R7, a backgate also connected to the GND and a gate connected to a control-signal input terminal CS3. Thus, when a H-level of voltage from the control part (not shown) is impressed on the control-signal input terminal CS3, the Nch-MOSFET N3 is turned on, so that a potential at the other terminal of the charging condenser $C_n$ is outputted to the GND serving as the other voltage output terminal.

The Nch-MOSFET N4 has a drain connected to the terminal $C_nA$ on one side of the condenser $C_n$ and a source connected to a voltage output terminal S and a cathode of the zener diode ZD3. The anode of the zener diode ZD3 is connected to the GND. In FIG. 1, since the input impedance of the A/D converter in the voltage converting part 3 is remarkably high, there is a possibility that a voltage of the voltage output terminal S is so elevated to destroy the second group of MOSFETs due to the electric capacitance of the part 3 and a leakage current flowing therein. The zener diode ZD3 is inserted in order to prevent such a destruction of the second group of switches.

In the Nch-MOSFET N4, its backgate is connected to the GND, while the gate is connected to a control-signal input terminal CS4. Thus, when a H-level of voltage from the control part (not shown) is impressed on the control-signal input terminal CS4, the Nch-MOSFET N4 is turned on, so that a potential at the terminal $C_nA$ of the charging condenser $C_n$ is outputted to the voltage output terminal S.

The above-mentioned Pch-MOSFETs P1 and P2 are formed by high-voltage resistant transistors. Therefore, the Pch-MOSFETs P1 and P2 can utilize the measured voltage source $V_{Cn}$ connected to the voltage input terminals $B_n$, $B_{n-1}$ in itself for a power source for driving the gates of the Pch-MOSFETs P1 and P2.

That is, between the gate and the source of the high-voltage resistant Pch-MOSFET P1, the resistance R1 and the zener diode ZD11 are connected in parallel with each other through the resistance R2. During an ON state of the high-voltage resistant Nch-MOSFET N2, the zener diode ZD1 is subjected to zener yield, allowing a voltage between the gate and the source of the Pch-MOSFET P1 to be maintained at a yield voltage. While, during an OFF state of the high-voltage resistant Nch-MOSFET N2, the gate and the source of the Pch-MOSFET P1 are connected in short through the resistance R1, so that the gate charge of the Pch-MOSFET Q2 accumulated during the ON state is discharged and the gate potential of the Pch-MOSFET Q2 is fixed to a source potential.

Similarly, between the gate and the source of the high-voltage resistant Pch-MOSFET P2, the resistance R4 and the zener diode ZD2 are connected in parallel with each other through the resistance R5. During an ON state of the high-voltage resistant Nch-MOSFET N1, the zener diode ZD2 is subjected to zener yield, allowing a voltage between the gate and the source of the Pch-MOSFET P2 to be maintained at a yield voltage. While, during an OFF state of the high-voltage resistant Nch-MOSFET N1, the gate and the source of the Pch-MOSFET P2 are connected in short through the resistance R4, so that the gate charge of the Pch-MOSFET P2 accumulated during the ON state is discharged and the gate potential of the Pch-MOSFET P2 is fixed to a source potential.

Accordingly, there is no need of providing a special power source that supplies voltages to be impressed on the gates in order to activate or inactivate the Pch-MOSFETs P1 and P2, allowing the voltage measurement device to be small-sized at a low price.

Note, the above-mentioned first group of switches may be formed by high-voltage resistant Nch-MOSFETs. However, when using the high-voltage resistant Pch-MOSFETs P1 and P2 in the above way, it is possible to make a circuit structure of the device simpler than that in case of using the high-voltage resistant Nch-MOSFETs for the same purpose. Namely, if the high-voltage resistant Nch-MOSFETs are employed in place of the high-voltage resistant Pch-MOSFETs P1 and P2, then it is necessary to establish a gate potential for activating the Nch-MOSFETs higher than the source potential by a threshold voltage. Additionally, as the source potential rises up to the vicinity of a potential of the voltage source to be measured on the drain's side on condition that each Nch-MOSFET is tuned on, such an activated state of the Nch-MOSFET could not be maintained unless the gate voltage is raised higher than the potential of the voltage source to be measured. Thus, it is impossible that the voltage source to be measured is directly utilized as a power source for driving the gates as the Pch-MOSFETs were used. Consequently, there would be separately required a circuit that generates gate-driving voltages higher than the potentials of the voltage source to be measures at the voltage input terminals $B_n$, $B_{n-1}$ by threshold voltages. It might be expected to employ floating power drive, bootstrap drive, charge pump drive, etc. in order to generate such gate-driving voltages. Then, however, the structure of a circuit would be complicated.

Next, we describe the operation of the above voltage measuring part 2.

First, the control part supplies the control-signal input terminals CS3 and CS4 with control signals of low level (which will be referred to as "L-level" after) and also supplies the control-signal input terminals CS1 and CS2 with H-level control signals. Consequently, the Nch-MOSFETs N1 and N2 are turned on, so that the Pch-MOSFETs P2 and P1 are also turned on. While, the Nch-MOSFETs N3 and N4 are turned off.

In this state, a current flows from the voltage source $V_{Cn}$ to be measured and therefore, the condenser $C_n$ is charged electrically. This charging is maintained while holding the control signals for the control-signal input terminals CS1 and CS2 at H-levels until a voltage between both terminals of the condenser $C_n$ becomes equal to a voltage between both terminals $B_n$, $B_{n-1}$ of the voltage source $V_{Cn}$ to be measured.

Next, the control part 4 supplies the control-signal input terminals CS1 and CS2 with L-level control signals. Consequently, the Nch-MOSFETs N1 and N2 are turned off, so that the Pch-MOSFETs P2 and P1 are also turned off. Further, the Nch-MOSFETs N3 and N4 are maintained in the OFF state. In this state, the condenser $C_n$ holds a voltage based on the previous charging operation.

Next, the control part supplies the control-signal input terminals CS3 and CS4 with H-level control signals. Consequently, the Nch-MOSFETs N3 and N4 are together turned on, so that a voltage between both ends of the condenser $C_n$ is generated between the voltage output terminal S and the ground (GND) also serving as another voltage output terminal.

Here, it is noted that junction capacitances due to PN junction exist in the semiconductor elements forming the voltage measurement circuit 21 parasitically. The voltage measurement circuit considering the junction capacitances and its equivalent circuit are shown in FIGS. 3 and 4, respectively (FIG. 4 overlaps switches or the like).

Figure 3:
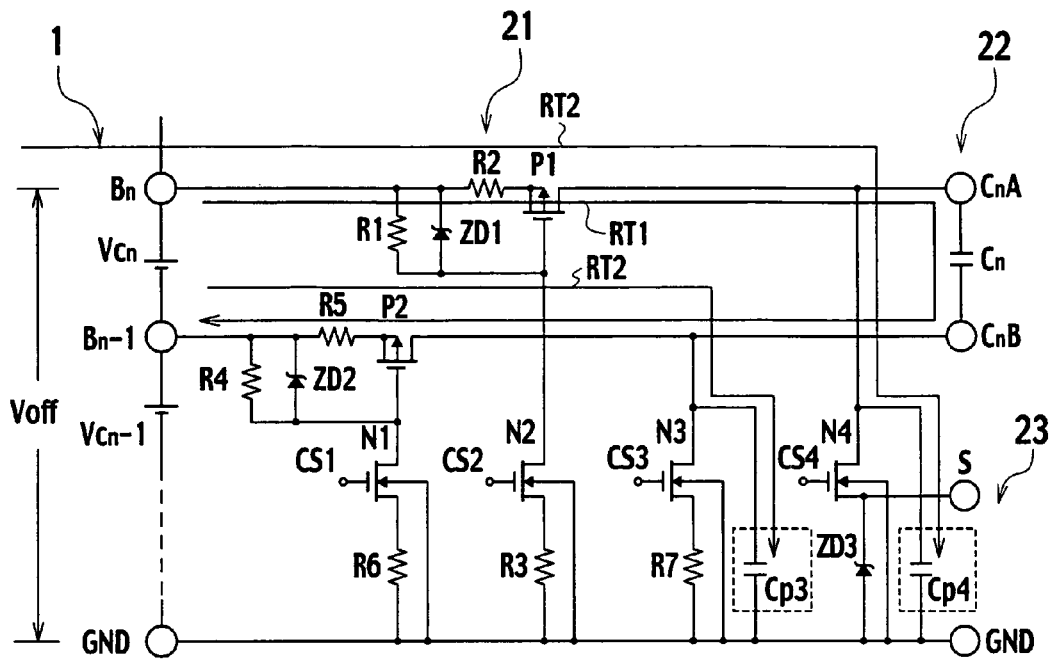
FIG. 3 is a schematic circuit diagram of a voltage measurement circuit out of consideration for parasitic capacitances of semiconductor elements forming the second group of switches, also explaining the measuring principle of the voltage measurement device of the present invention.
Figure 4:
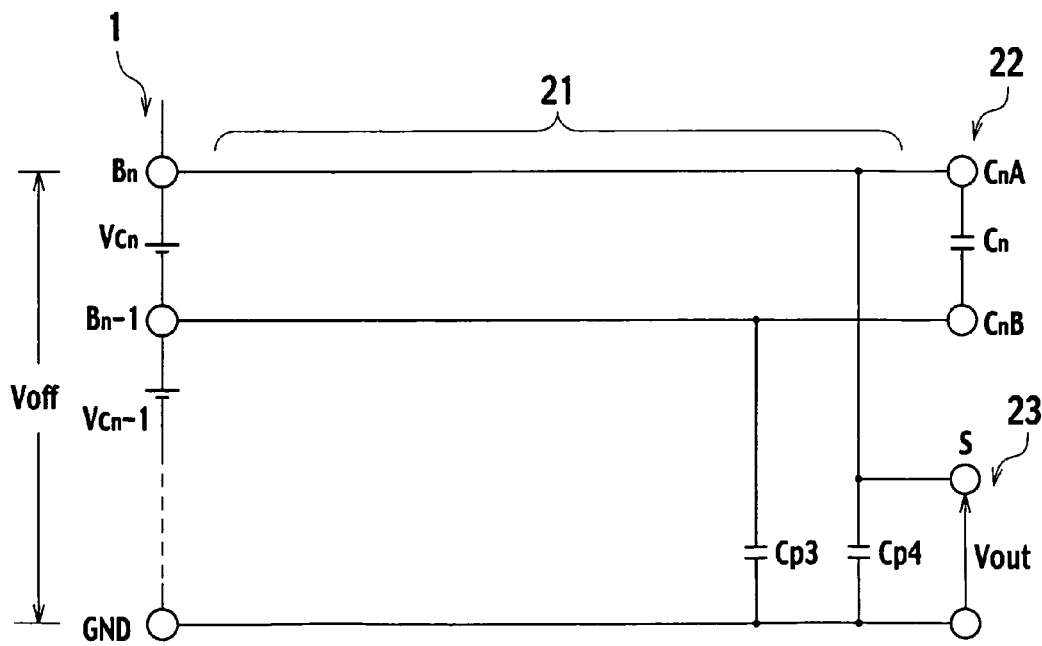
FIG. 4 is an equivalent circuit diagram of the voltage measurement circuit of FIG. 3.

In FIGS. 3 and 4, "Cp3" and "Cp4" respectively denote a parasitic capacitance between the drain and the GND of the Nch-MOSFET N3 and a parasitic capacitance between the drain and the GND of the Nch-MOSFET N4, while "$C_n$" designates a charging condenser (capacitive element) of the condenser circuit 22.

In the voltage measurement circuit 21 of FIGS. 3 and 4, the parasitic capacitance influencing on an output voltage of the circuit is the parasitic capacitance Cp4 in between the drain of the Nch-MOSFET N4 and the GND (depending on a voltage, for example, having a value of 30-7 pF at 0.5V to 200 V). When charging a voltage, it is carried out to charge the charging condenser $C_n$ with the use of a route RT1 in FIG. 3 and simultaneously, electrical charges are accumulated in the parasitic capacitances Cp3, Cp4 in each between the drains of the Nch-MOSFETs N3, N4 and the GND in another route RT2 in FIG. 3. Then, at the stage of measuring the voltage, a voltage charged in the parasitic capacitance Cp4 in between the drain of the Nch-MOSFET N4 and the GND appears at the terminal S while being added to a voltage charged in the charging condenser $C_n$. In connection, a voltage charged in the parasitic capacitance Cp3 in between the drain of the Nch-MOSFET N3 and the GND is discharged through the GND of the output terminal 23 and therefore, it does not appear at the terminal S of the output terminal 23.

Accordingly, the voltage $V_{out}$ measured at the output terminal 23 is shifted to its increasing side from a true battery voltage $V_{Cn}$ (corres. to a voltage of each block defined in the Claims of the Invention) by a voltage accumulated in the parasitic capacitance Cp4, which corresponds to a measurement error $\Delta V_{out}$.

Figure 5:
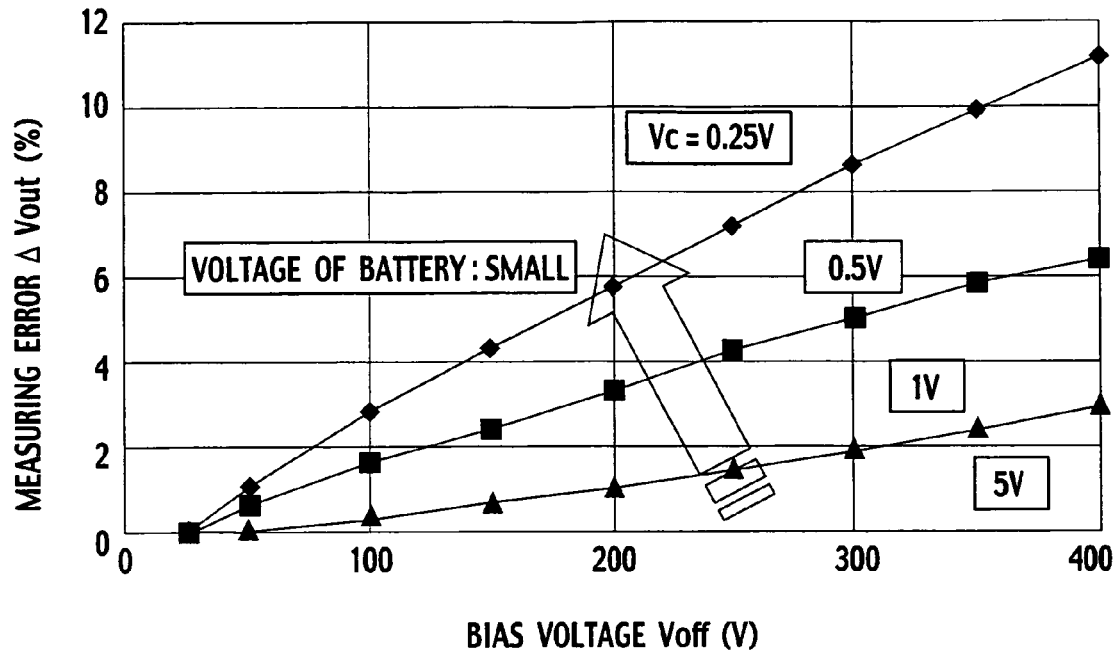
FIG. 5 is a graph showing a relationship between error voltage and bias voltage due to the parasitic capacitances in case of changing the battery voltage, also explaining the measuring principle of the voltage measurement device of the present invention.

FIG. 5 shows a relationship between the bias voltage $V_{off}$ (horizontal axis) as being the total voltage of respective blocks and the measurement error $\Delta V_{out}$ (vertical axis) in case of changing the battery voltage Vc of each block of the battery 1 to 0.25V, 0.5V, 1V and 5V while fixing the capacitance of the charging condenser $C_n$ at 0.1 μF. From the relationship shown in FIG. 5, it will be understood that the measurement error $\Delta V_{out}$ gets larger in proportional to the bias voltage $V_{off}$ and that a variation of the error $\Delta V_{out}$ gets larger as the battery voltage becomes smaller.

Figure 6:
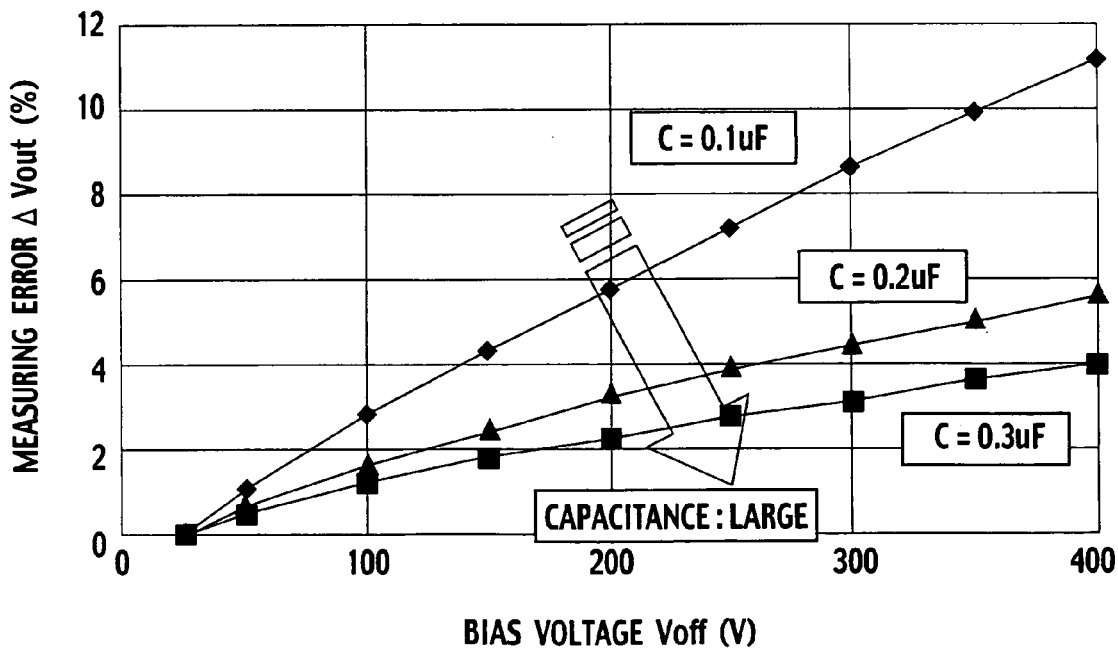
FIG. 6 is a graph showing a relationship between error voltage and bias voltage due to the parasitic capacitances in case of changing the capacity values of condensers, also explaining the measuring principle of the voltage measurement device of the present invention.

In opposition to FIG. 5, FIG. 6 shows a relationship between the bias voltage $V_{off}$ (horizontal axis) as being the total voltage of respective blocks and the measurement error $\Delta V_{out}$ (vertical axis) in case of changing the capacitance of the charging condenser $C_n$ to 0.1 μF, 0.2 μF and 0.3 μF while fixing the battery voltage Vc at 0.25V. From the relationship shown in FIG. 6, it will be understood that the measurement error $\Delta V_{out}$ gets larger in proportional to the bias voltage $V_{off}$ and that a variation of the error $\Delta V_{out}$ gets smaller as the capacitance of the charging condenser $C_{out}$ becomes larger.

Here note, if increasing the capacitance of the charging condenser $C_n$, then a shift amount in the measured voltage $\Delta V_{out}$, that is, the measurement error $\Delta V_{out}$ is reduced since a difference in electrical charges between the parasitic capacitances Cp3 and Cp4 becomes large. However, such a measure is unfavorable since it requires a long charging period far from the speeding-up of measurement.

Therefore, according to the invention, it is conceived to obtain a true value of the battery voltage on calculation of the shift amount of the measured voltage by the use of a microcomputer. This technique will be described below.

First, we find a calculation expression for the battery voltage $V_{Cn}$ from the equivalent circuit shown in FIG. 4.

The electrical charges accumulated in the parasitic capacitance Cp3 in between the drain of the Nch-MOSFET N3 of the voltage measurement circuit 21 and the GND is negligible in the following calculation because the same electrical charges is discharged to the GND terminal of the output terminal 23 when the Nch-MOSFET N3 is turned on. Here providing that respective electrical charges accumulated in the charging condenser $C_n$ and the parasitic capacitance Cp4 in between the gate and the GND of the Nch-MOSFET N4 are respectively represented by Qn, Qp4, the battery voltage $V_{Cn}$ can be calculated as follows.

$$Qn + Qp4 = (C_n + Cp4)V_{out} \quad (1)$$

$$C_n V_{Cn} + Cp4(V_{Cn} + V_{off}) = (C_n + Cp4)V_{out} \quad (2)$$

Then, $$V_{off} = \sum_{n=0}^{N-1} V_{Cn} \quad (3)$$

$$V_{Cn} = V_{out} - [Cp4 V_{off} / (C_n + Cp4)] \quad (4)$$

Thus, if only measuring the parasitic capacitance Cp4 of the Nch-MOSFET N4 in advance, the battery voltage $V_{Cn}$ of the block n can be calculated by subtracting an error in the second term on the right side of the above expression (4) from the output voltage $V_{out}$ of the output terminal 23.

Figure 7:
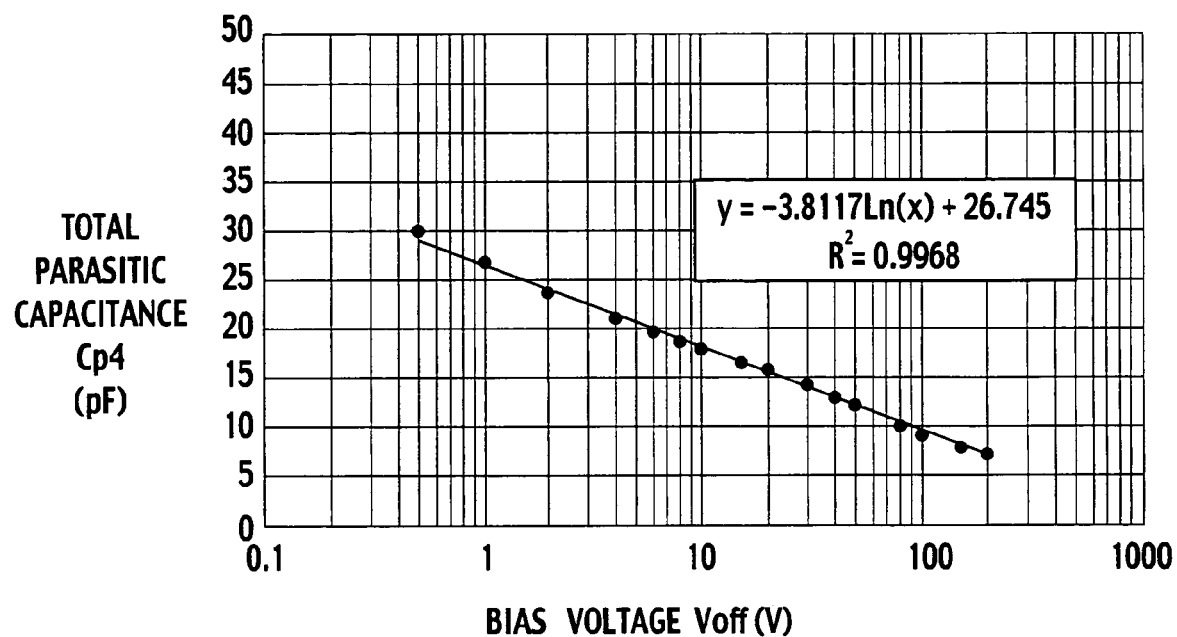
FIG. 7 is a semilogarithmic graph showing a relationship between bias voltage and total parasitic capacitance.

FIG. 7 is a semilogarithmic graph showing an observed result of the parasitic capacitance Cp4 of the Nch-MOSFET N4. In the figure, a horizontal axis (logarithm) denotes a bias voltage $V_{off}$, while a vertical axis denotes a total parasitic capacitance Cp4. From the relationship between the bias voltage $V_{off}$ and the total parasitic capacitance Cp4 in FIG. 7, it is found that the total parasitic capacitance Cp4 has voltage-dependent property. For instance, with the application of least-squares method on respective plots in the semilogarithmic graph, a relational expression between Cp4 and $V_{off}$ can be represented by the following expression.

$$Cp4 = a \cdot 1n(V_{off}) + b$$

In the shown example of FIG. 7, the above expression can be embodied as follows.

$$Cp4 = -3.8117 \times 1n(V_{off}) + 26.745$$

(Note: coefficient of determination R2=0.9968)

Thus, in the respective blocks forming the battery 1, it is first executed to measure the measured voltage $V_{out}$ of the first block 1 and further calculate a bias voltage $V_{off}$ by the above expression (3).

In case of the first block, the following relationship is established from the above expression (3).

$$V_{off} = V_{C0} \text{ (e.g. } V_{C0} = 0V)$$

Note, in case of the second block 2, the bias voltage $V_{off}$ is obtained as follows.

$$V_{off} = V_{C0} + V_{C1}$$

That is, the calculated battery voltage $V_{C1}$ is added. Subsequently, in case of the third block 3, the bias voltage $V_{off}$ is obtained as follows.

$$V_{off} = V_{C0} + V_{C1} + V_{C2}$$

In case of the $N^{th}$ block N, the bias voltage $V_{off}$ is obtained as follows.

$$V_{off} = V_{C0} + V_{C1} + V_{C2} + \ldots + V_{Cn-1}$$

Next, from the relationship between the bias voltage $V_{off}$ and the total parasitic capacitance Cp4 in FIG. 7, it is carried out to obtain the parasitic capacitance Cp4 corresponding to the above-calculated bias voltage $V_{off}$.

Finally, the battery voltage $V_{c1}$ of the block 1 is calculated by substituting the measured voltage $V_{out}$, the bias voltage $V_{off}$, the parasitic capacitance Cp4 and the capacitance of the charging condenser $C_n$ into the above expression (4).

Since the bias voltage $V_{off}$ is a sum of battery voltages, it is possible to calculate the battery voltage $V_{Cn}$ of the $n^{th}$. block n with accuracy by calculating the measured voltages $V_{out}$ from the first block 1 C, in order.

Therefore, since the above technique allows an error in the measured voltage due to the parasitic capacitances to be calculated in advance, it is possible to calculate a true value from the measured data including the error by a calculating circuit, such as an external microcomputer. Thus, if employing a voltage-correction type voltage measurement system based on the above measuring technique, then there can be effected the following merits of: (1) making an expensive large-capacitive condenser unnecessary; (2) accomplishing miniaturization and speed-up of the device with the possibility of reducing the capacitances of the condensers; (3) correcting the measured voltage thereby providing data with high accuracy and so on.

With reference to FIGS. 8 to 13, the first to third embodiments embodying the measuring principle of the above voltage measurement device of the invention will be described below.

1st. Embodiment

Figure 8:
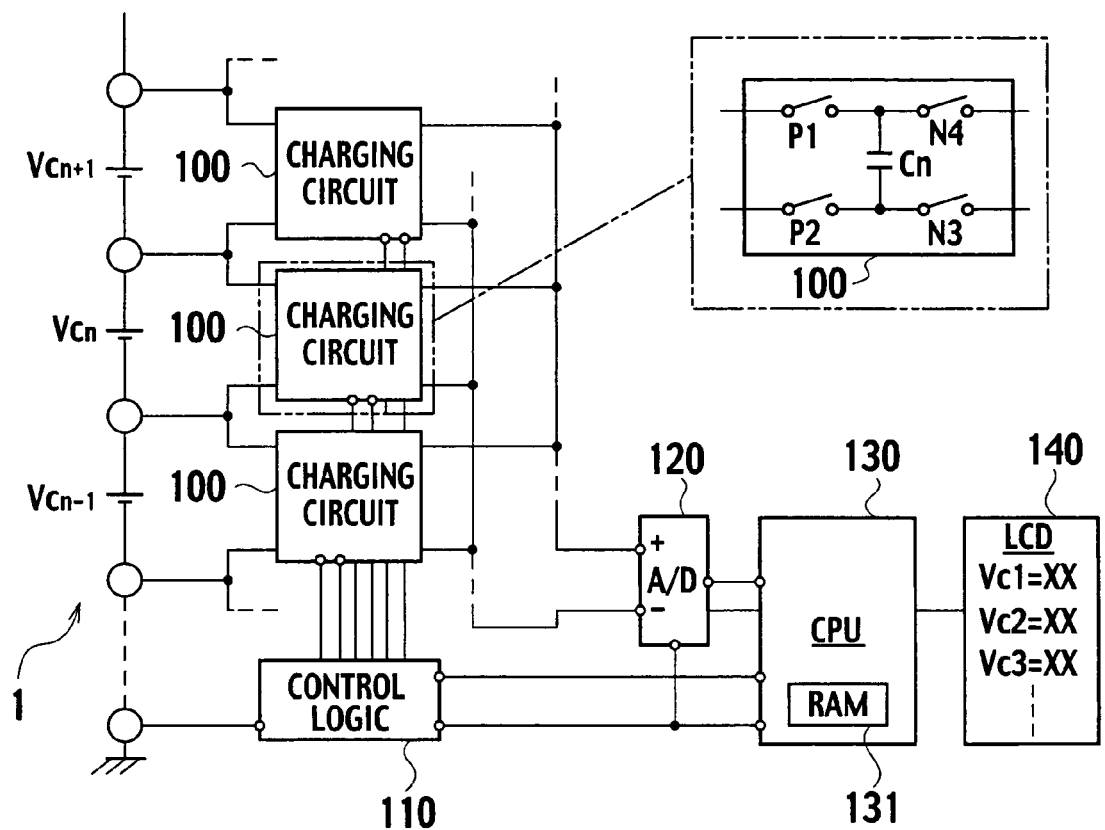
FIG. 8 is a schematic block diagram showing the whole structure of a voltage-compensation type voltage measurement system in accordance with the first embodiment of the invention.

FIG. 8 is a view showing the whole structure of a voltage-correction type voltage measurement system in accordance with the first embodiment of the present invention. The shown voltage-correction type voltage measurement system includes charging circuits 100 forming the voltage measurement circuits connected to the voltage sources to be measured (e.g. $V_{Cn-1}$, $V_{Cn}$, $V_{Cn+1}$) of the respective blocks (e.g. n−1, n, n+1) of the battery 1 through respective voltage input terminals on both sides of each circuit 100, a control circuit (Control Logic) 110 for controlling ON/OFF operations of the switches in each charging circuit 100, an A/D converter (Analog to Digital Converter) 120 forming the voltage converting part connected to respective output terminals of each charging circuit 100, a CPU (Central Processing Unit) 130 that controls the operations of the control circuit 110 and the A/D converter 120 and forms an external calculating circuit (calculating means) for inputting measured data (digital quantity) converted by the A/D converter 120 and an LCD (Liquid Crystal Display) 140 for displaying calculation results of the measured voltages of the battery 1.

Each of the charging circuits 100 is similar in structure to the afore-mentioned voltage measuring part and includes semiconductor elements P1, P2 forming the first group of switches, a charging condenser $C_n$, semiconductor elements N3, N4 forming the second group of switches and not-shown switching elements N2, N1 also forming the second group of switches to control the elements P1, P2.

The control circuit 110 is connected to respective gates the semiconductor elements N2, N1 forming the third group of switches for controlling the semiconductor elements P1, P2 forming the first group of switches in the charging circuits 100 and respective gates of the semiconductor elements N3, N4 forming the second group of switches. Based on operational-timing control signals outputted from the CPU 130, the control circuit 110 outputs control signals for turning on/off the switches to the respective gates of the semiconductor elements P1, P2, N3 and N4.

The A/D converter 120 is similar in structure to the afore-mentioned voltage converting part. In operation, the A/D converter 120 inputs a terminal voltage between the terminal S and the GND as the output terminals of the charging circuit 100 of each block. Corresponding to a sampling clock based on the operational-timing control signals from the CPU 130, the A/D converter 120 converts a terminal voltage of analog quantity to the same of digital quantity and further outputs the so-measured data (digital quantity) to the CPU 130.

The CPU 130 includes a not-shown ROM (Read Only Memory) for storing a control program and control data therein and a RAM (Random Access Memory) 131 being an interior storage circuit (storing means) for inputting calculation results. With the execution of the control program stored therein, for example, the CPU 130 transmits a control signal for controlling the operational timing of the sampling clock to the A/D converter 120 and also transmits a control signal for controlling the operational timing of turning on/off the switches of the semiconductor elements P1, P2, N3 and N4. Additionally, on receipt of the measured data of digital quantity converted by the A/D converter 120, the CPU 130 carries out various calculations (mentioned later) on the ground of the above-mentioned measuring principle and further outputs the calculation results to the LCD 140 for display.

Figure 9:
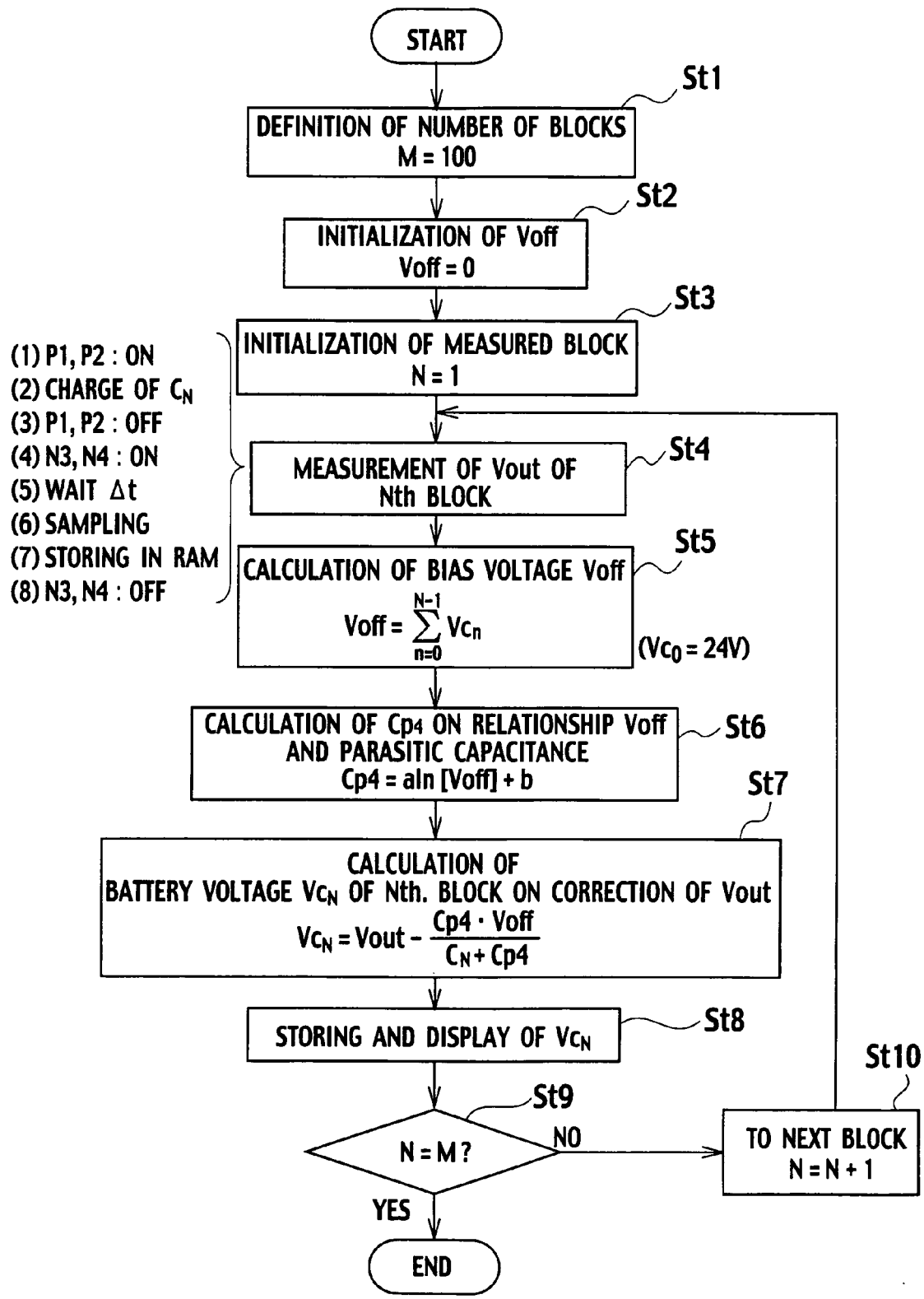
FIG. 9 is a flow chart for explanation of the overall operation of the voltage-compensation type voltage measurement system of the first embodiment.

Next, the whole operation of the voltage-correction type voltage measurement system of the embodiment will be described with reference to FIG. 9. FIG. 9 shows a control flow chart typically representing the processing order of the control program executed by the CPU 130. Note, the control program is stored in the ROM (not shown) in the CPU 130.

With the execution of the control program in the ROM, the CPU 130 first carries out a definition of the number M of blocks (e.g. M=100) at step St1, an initialization of a bias voltage $V_{off}$ (i.e. $V_{off}$=0) at step St2 and an initialization of a measured block N (i.e. N=0) at step St3, successively.

Next, at step St4, it is executed to measure a measured voltage of the $N^{th}$ block 2. At this measuring, the CPU 130 controls the operational timings of both the control circuit 110 and the A/D converter 120 in the following procedures (1) to (8).

Figure 10:
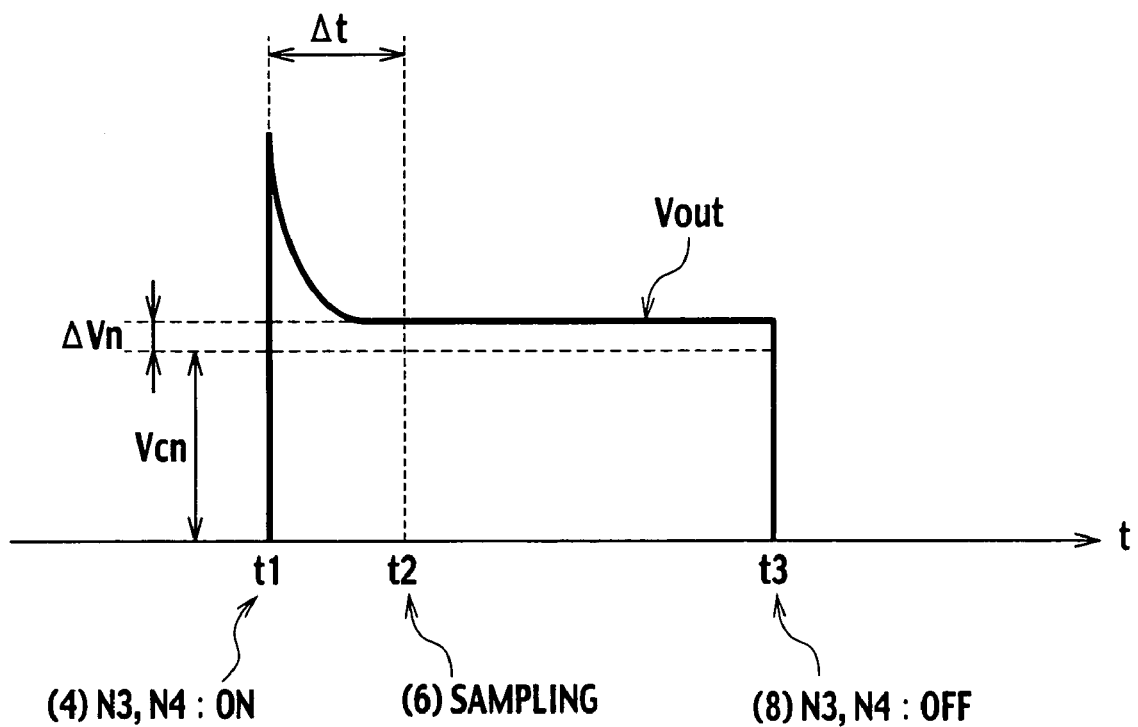
FIG. 10 is a waveform diagram explaining the operational timing of sampling measured data.

(1) Turn on the semiconductor elements P1, P2 in the first group;
(2) Charge the charging condenser $C_n$;
(3) Turn off the semiconductor elements P1, P2 in the first group;
(4) Turn on the semiconductor elements N3, N4 in the second group;
(5) Wait for a predetermined time $\Delta t$;
(6) Perform to sample a terminal voltage of the output terminal at the A/D converter 120;
(7) Store a measured data obtained by the A/D converter 120 in the RAM 131 of the CPU 130;
(8) Turn off the semiconductor elements N3, N4 in the second group FIG. 10 shows a time series change of the waveform data of a terminal voltage $V_{out}$ (=true voltage $V_{Cn}$+error voltage $\Delta V_{Cn}$) of the output terminal of the charging circuit 100 in the period from the above procedures (4) to (8) typically. Immediately after turning on the switches of the semiconductor elements N3, N4 (at t1), an overshoot occurs in the terminal voltage $V_{out}$ at time t1 since the electrical charges charged in the parasitic capacitance Cp4 are abruptly charged into the charging condenser $C_n$. Therefore, by sampling the terminal voltage with a delay of the predetermined time $\Delta t$ from time t1 in view of avoiding this overshoot, it is possible to improve the measuring accuracy of the system furthermore.

Next, the bias voltage $V_{off}$ is calculated by the above expression (3) at step St5. In case of the first block, the bias voltage $V_{off}$ is as follows.

$V_{off}=V_{C0}=0V$

Here, the bias voltage $V_{off}$ in case of the second block is as follows.

$V_{off}=V_{C0}+V_{C1}$

The bias voltage $V_{off}$ in case of the third block is as follows.

$V_{off}=V_{C0}+V_{C1}+V_{C2}$

Similarly, in case of the $N^{th}$. block, the bias voltage $V_{off}$ is as follows.

$V_{off}=V_{C0}+V_{C1}+V_{C2}+\ldots+V_{Cn-1}$

Next, the parasitic capacitance Cp4 is calculated from the relationship $[Cp4=a\cdot \ln(V_{off})+b]$ between the bias voltage $V_{off}$ and the parasitic capacitance Cp4 at step St6.

Then, from the above expression (4), the measured voltage $V_{out}$ is corrected to calculate the battery voltage $V_{Cn}$ of the $N^{th}$. block (step St7).

At next step St8, the battery voltage $V_{Cn}$ is stored in the RAM 131 of the CPU 130 and further displayed on the LCD 140.

Next, at step St9, it is executed to judge whether the measurement for all the blocks has been completed (N=M) or not. If the judgment at step St9 is No (i.e. N≠M), in other words, when the measurement for all the blocks has not been completed, then the routine goes to step St10 where the increment of the number of blocks is performed (N=N+1). Thereafter, the routine returns to step St4 and sequent steps where the similar processes are performed against the next block repeatedly. While, if the judgment at step St9 is Yes (i.e. N=M), in other words, when the measurement for all the blocks has been completed, then all the processes is ended.

Figure 11A:
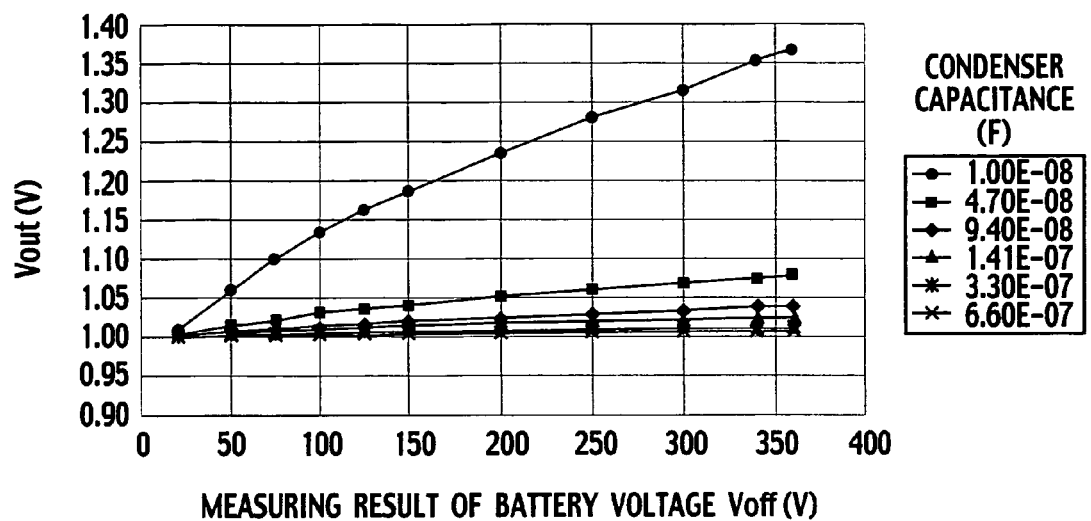
Figure 11B:
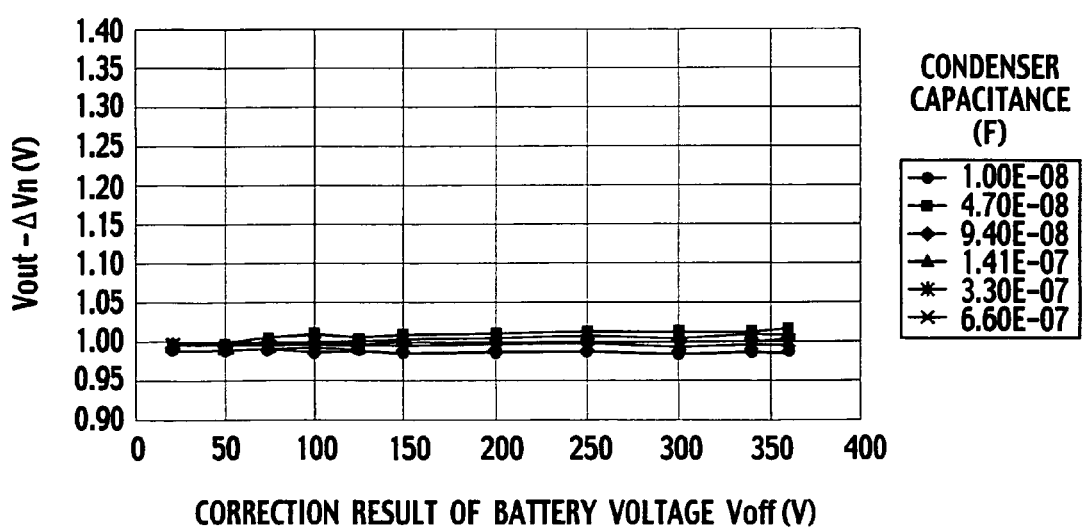
FIG. 11B is a graph showing the compensating results of battery voltages.

FIG. 11A shows the measuring results of the battery voltages $V_{out}$ in case of changing the capacitance of the charging condenser $C_n$. FIG. 11B shows the results of correcting the battery voltages by the above-mentioned calculations. In FIG. 11A, a horizontal axis represents values of the bias voltage $V_{off}$, while a vertical axis represents values of the measured voltage $V_{out}$. In FIG. 11B, a horizontal axis represents values of the bias voltage $V_{off}$, while a vertical axis represents values of the corrected voltage $(=V_{out}-\Delta V_n$: "$\Delta V_n$" is an error of the second term on the right side of the above expression (4), namely, error voltage.).

From FIGS. 11A and 11B, it is confirmed that the system of the first embodiment enables the measuring error $\Delta V_n$ of the measured voltage $V_{out}$ due to the parasitic capacitance Cp4 to be reduced remarkably irrespective of the capacitance of the charging condenser $C_n$ and the value of the bias voltage $V_{out}$.

2$^{nd}$. Embodiment

The voltage-correction type voltage measurement system of the second embodiment of the present invention has a circuit structure similar to that of the above-mentioned system of the first embodiment shown in FIG. 8. However, the voltage measurement system of the second embodiment is different from the voltage measurement system of the first embodiment with respect to its operation. Therefore, only differences from the operation of the system of the first embodiment will be described below.

Figure 12:
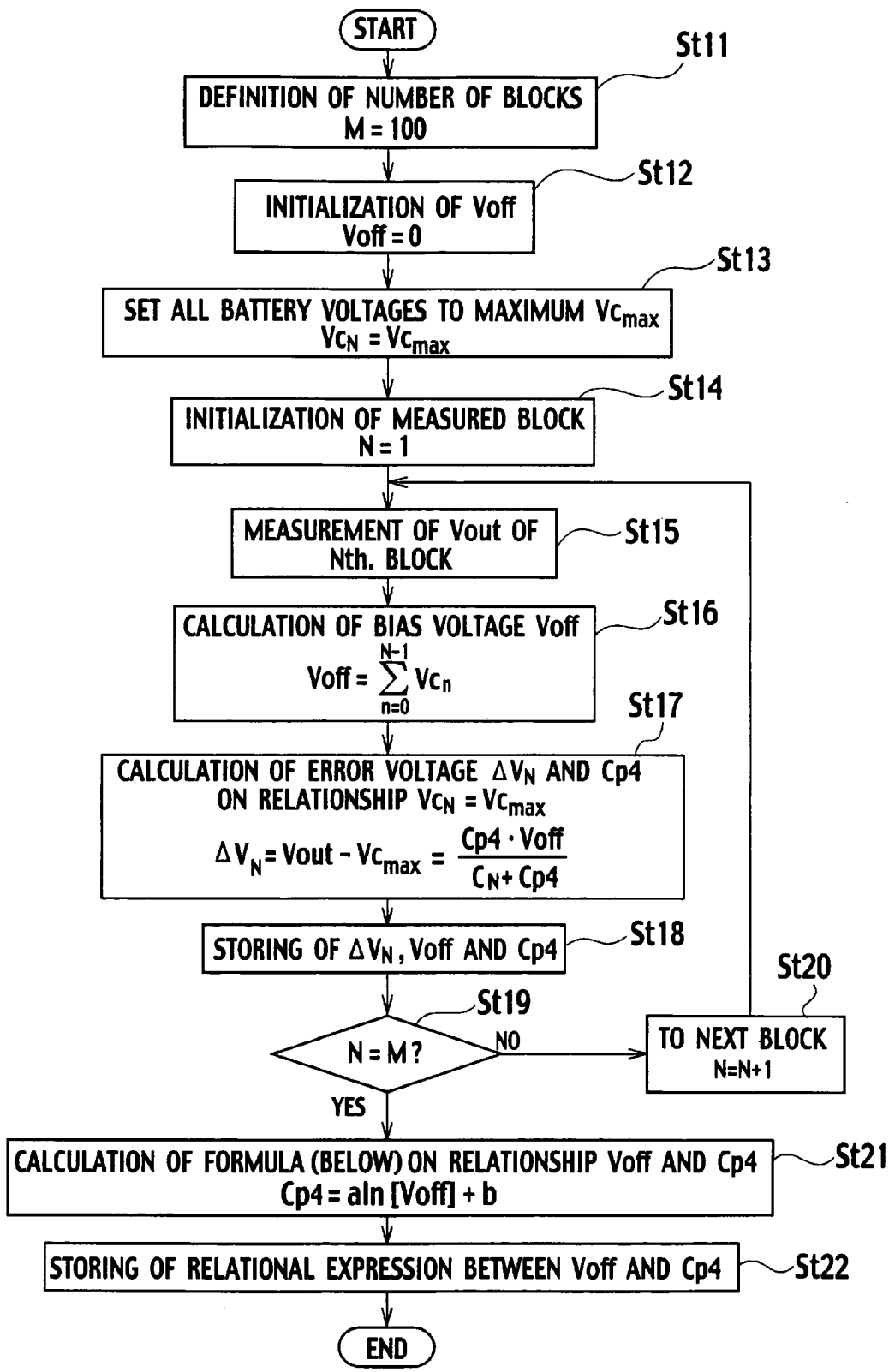
FIG. 12 is a flow chart for explanation of the overall operation of the voltage-compensation type voltage measurement system of the second embodiment.

FIG. 12 is a flow chart explaining the whole operation of the voltage-correction type voltage measurement system of this embodiment. Note, the shown flow chart is a control flow chart typically representing the processing order of the control program executed by the CPU 130. This control program is stored in the ROM (not shown) in the CPU 130.

In FIG. 12, with the execution of the control program in the ROM, the CPU 130 first carries out a definition of the number M of blocks (e.g. M=100) at step St11, an initialization of a bias voltage $V_{off}$ (i.e. $V_{off}=0$) at step St12, an establishment of all the battery voltages at the maximum value $V_{Cmax}$ at step St13 and an initialization of a measured block N (i.e. N=0) at step St14, successively.

Next, at step St15, it is executed to measure a measured voltage of the $N^{th}$ block. At this measuring, the CPU 130 controls the operational timings of both the control circuit 110 and the A/D converter 120 in the above-mentioned procedures (1) to (8).

Next, the bias voltage $V_{off}$ is calculated by the above expression (3) at step St16. In case of the first block, the bias voltage $V_{off}$ is as follows.

$V_{off}=V_{C0}=0V$

Here, the bias voltage $V_{off}$ in case of the second block is as follows.

$V_{off}=V_{C0}+V_{C1}$

The bias voltage $V_{off}$ in case of the third block is as follows.

$V_{off}=V_{C0}+V_{C1}+V_{C2}$

Similarly, in case of the $N^{th}$. block, the bias voltage $V_{off}$ is as follows.

$V_{off}=V_{C0}+V_{C1}+V_{C2}+\ldots+V_{Cn-1}$

Next, from the relationship of an equality of "battery voltage $V_{Cn}=V_{Cmax}$" it is executed to calculate the error voltage $\Delta V_n$ [i.e. an error of the second term on the right side of the above expression (4)] and the parasitic capacitance Cp4 at step St17.

Then, the error voltage $\Delta V_n$, the bias voltage $V_{off}$ and the parasitic capacitance Cp4 are stored in the RAM 131 (step St18).

Next, at step St19, it is executed to judge whether the measurement for all the blocks has been completed (N=M) or not. If the judgment at step St19 is No (i.e. N≠M), in other words, when the measurement for all the blocks has not been completed, then the routine goes to step St20 where the increment of the number of blocks is performed (N=N+1). Thereafter, the routine returns to step St15 and sequent steps where the similar processes are performed against the next block repeatedly. While, if the judgment at step St19 is Yes (i.e. N=M), in other words, when the measurement for all the blocks has been completed, it is executed to calculate the relational expression of "$Cp4=a\cdot \ln(V_{off})+b$" in the relationship between the bias voltage $V_{off}$ and the parasitic capacitance Cp4 by means of the least squares method (step St21). Next, the so-obtained relational expression between the bias voltage $V_{off}$ and the parasitic capacitance Cp4 is stored in the RAM 131 at step St22.

In the above-mentioned embodiment, it is noted that the error voltage $\Delta V_n$ due to the stray capacitance including the parasitic capacitance Cp4 of the second group of switches is previously calculated by measuring the known voltages of the respective blocks. Further, the stray capacitances of the respective blocks are calculated by the calculated error voltage $\Delta V_n$ and subsequently stored in the RAM 131. Therefore, different from the first embodiment of the invention, there is no need of measuring the stray capacitances peculiarly. In detail, at mass-producing and checking of the operations of the system, the stray capacitances are calculated by measuring the known voltages of the respective blocks and the calculated stray capacitances are stored in the RAM 131. Under such circumstances, when measuring the voltage of each block, the corresponding calculated stray capacitance is read out and successively, the error voltage $\Delta V_n$ due to the stray capacitance including the parasitic capacitance Cp4 of the second group of switches is calculated. In this way, a true value of the block voltage can be obtained by subtracting the so-obtained error voltage $\Delta V_n$ from a measured voltage of each block.

Note, we have confirmed that effects similar to those in FIGS. 11A and 11B could be realized in the second embodiment as well.

$3^{rd}$. Embodiment

The voltage-correction type voltage measurement system of the third embodiment of the present invention has a circuit structure similar to that of the above-mentioned system of the first embodiment shown in FIG. 8. However, the voltage measurement system of the third embodiment is different from the voltage measurement system of the first embodiment with respect to its operation. Therefore, only differences from the operation of the system of the first embodiment will be described below.

Figure 13:
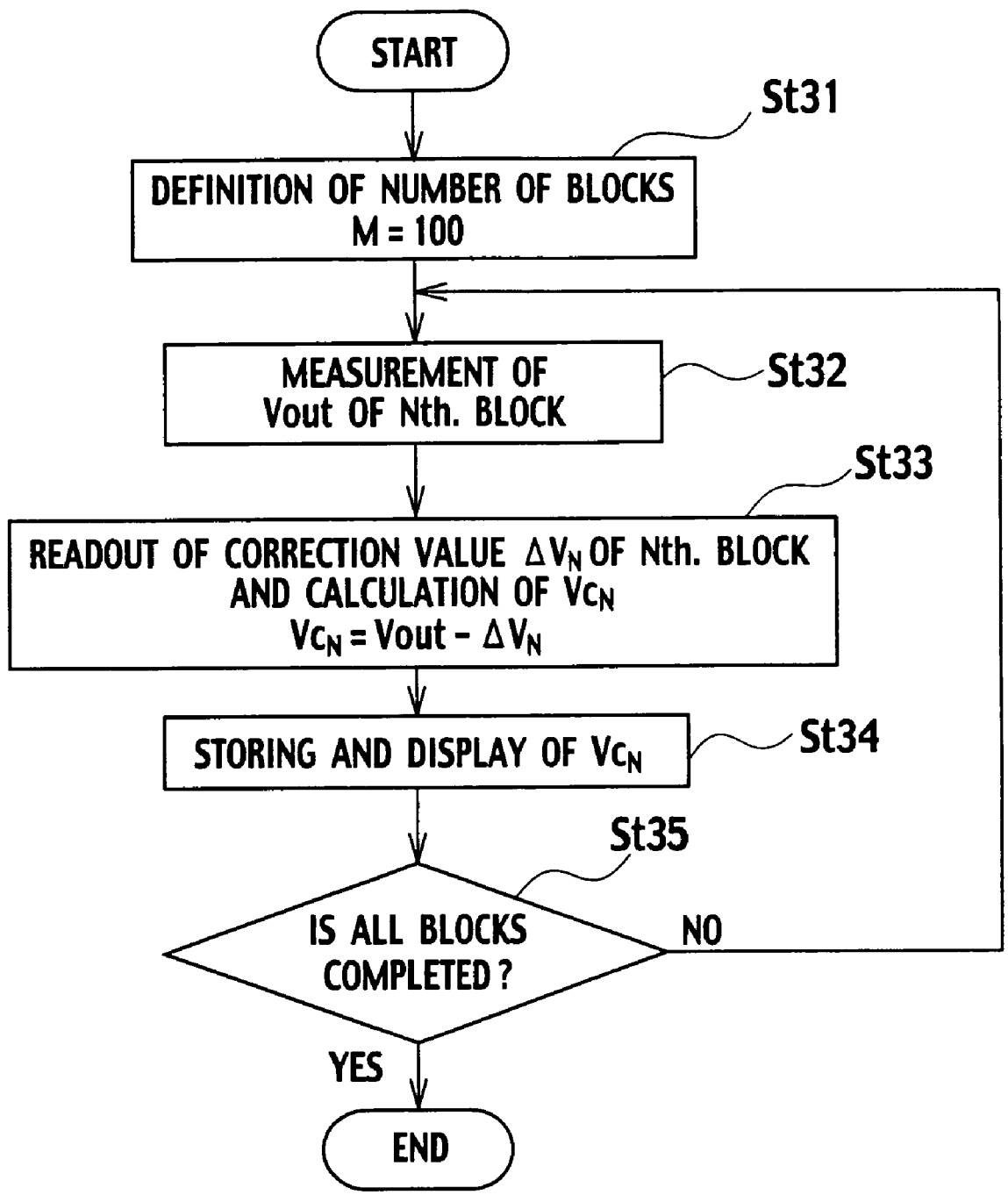
FIG. 13 is a flow chart for explanation of the overall operation of the voltage-compensation type voltage measurement system of the third embodiment.

FIG. 13 is a flow chart explaining the whole operation of the voltage-correction type voltage measurement system of this embodiment. Note, the shown flow chart is a control flow chart typically representing the processing order of the control program executed by the CPU 130. This control program is stored in the ROM (not shown) in the CPU 130.

In FIG. 13, with the execution of the control program in the ROM, the CPU 130 first carries out a definition of the number M of blocks (e.g. M=100) at step St31.

Next, at step St32, it is executed to measure a measured voltage $V_{out}$ of the optional $N^{th}$ block. At this measuring, the CPU 130 controls the operational timings of both the control circuit 110 and the A/D converter 120 in the above-mentioned procedures (1) to (8).

Next, from the expression (3), it is executed to read a correction value (error voltage) $\Delta V_n$ of the $N^{th}$ block out of the RAM 131 and further calculate the battery voltage $V_{Cn}$ of the $N^{th}$ block ($V_{Cn}=V_{out}-\Delta V_n$) at step St33.

At next step St34, the battery voltage $V_{Cn}$ is stored in the RAM 131 of the CPU 130 and further displayed on the LCD 140.

Next, at step St35, it is executed to judge whether the measurement for all the blocks has been completed (N=M) or not. If the judgment at step St35 is No (i.e. N≠M), in other words, when the measurement for all the blocks has not been completed, then the routine returns to step St32 and sequent steps where the similar processes are performed against the next block repeatedly. While, if the judgment at step St35 is Yes (i.e. N=M), in other words, when the measurement for all the blocks has been completed, then all the processes is ended.

In the third embodiment, it is noted that the error voltage of each block is subtracted from the measured terminal voltage directly. Therefore, if a block voltage of the block to be measured varies, then accurate measurement of voltage cannot be accomplished due to a change in the error voltage. According to the embodiment, however, it is possible to measure the battery voltages quickly because the number of processes is reduced with simple calculations.

As mentioned above, according to the present invention, since an error in the measured voltage due to the stray capacitance can be obtained in advance, it becomes possible to calculate a true value from the measured data containing the error. Thus, by correcting the measured voltage, it is possible to provide a voltage data with high accuracy. Additionally, since any expensive large-capacious condenser is not necessary, the circuit as a whole can be provided at a low price.

Further, as the capacitances of condensers can be reduced, it is possible to accomplish the speeding-up operation in measuring the voltages.

Further, according to the present invention, at mass-producing and checking the operations, known voltages of the respective blocks are measure to calculate error voltage due to the stray capacitances. Then, by the calculated values of the error voltages, the stray capacitances of the blocks are calculated and stored. Under such circumstances, when measuring the voltage of each block, the corresponding calculated stray capacitance is read out to calculate the error voltage and further, the so-obtained error voltage is subtracted from a terminal voltage at the measuring output terminal to obtain a true value of the measured voltage of each block. Therefore, different from the invention of the first aspect, there is no need of measuring the stray capacitances peculiarly.

Furthermore, according to the present invention, since the error voltages of the respective blocks are subtracted from the measured voltages of the blocks directly, if a block voltage of the block to be measured varies, then accurate measurement of voltage could not be effected due to a change in the error voltage. However, since the number of processes is reduced with simple calculations, it is possible to measure the battery voltages quickly.

In addition, according to the present invention, it is possible to avoid a measuring error caused by a waveform of terminal voltage at the measuring output terminal just after the time when turning on the second group of switches, improving the measuring accuracy furthermore.

Thus, the present invention is also applicable to a voltage measurement device capable of accurate measurement of terminal voltages of respective battery cells in hundreds of accumulator batteries or fuel batteries, which are mounted on an electric car, a hybrid vehicle, etc. where the batteries are connected in series and therefore, hundreds of voltage is impressed.

The entire content of Japanese Patent Application No. P2004-293932 with a filing data of Oct. 6, 2004 of which is expressly incorporated herein by reference in its entirety.

It is also to be noted that, besides those already mentioned above, many modifications and variations of the above embodiments may be made without departing from the novel and advantageous features of the invention. Accordingly, all such modifications and variations are intended to be included within the scope of the appended claims.

What is claimed is:

1. A voltage measurement device, in a plurality of voltage sources in series connection that are divided into a plurality of blocks each having at least one voltage source, for measuring respective voltages of the blocks, the voltage measurement device comprising:

a measuring capacitive element connected to the blocks;

a first group of switches each arranged between the blocks and the measuring capacitive element to connect the voltages of the blocks to the measuring capacitive element;

a measuring output terminal connected to the measuring capacitive element;

a second group of switches each arranged between the measuring capacitive element and the measuring output terminal to connect the voltage of the blocks accumulated in the measuring capacitive element to the measuring output terminal; and calculating means connected to the measuring output terminal and adapted so as to perform the operations of:

measuring a stray capacitance including parasitic capacitances of the second group of switches in advance;

calculating an erroneous voltage due to electrical charges accumulated in the stray capacitance; and subtracting a calculated value of the erroneous voltage from a measured value of a terminal voltage of the measuring output terminal, thereby calculating a true value of a measured voltage of each of the blocks.

2. A voltage measurement device, in a plurality of voltage sources in series connection that are divided into a plurality of blocks each having at least one voltage source, for measuring respective voltages of the blocks, the voltage measurement device comprising:

a measuring capacitive element connected to the blocks;

a first group of switches each arranged between the blocks and the measuring capacitive element to connect the voltages of the blocks to the measuring capacitive element;

a measuring output terminal connected to the measuring capacitive element;

a second group of switches each arranged between the measuring capacitive element and the measuring output terminal to connect the voltage of the blocks accumulated in the measuring capacitive element to the measuring output terminal;

calculating means connected to the measuring output terminal; and storing means connected to the calculating means, wherein the calculating means is adapted so as to perform the operations of:

measuring known voltages of the blocks thereby calculating an erroneous voltage due to electrical charges accumulated in a stray capacitance including parasitic capacitances of the second group of switches;

calculating stray capacitances of the blocks by a calculated value of the erroneous voltage;

allowing the storing means to store calculated values of the stray capacitances of the blocks;

reading out the calculated values of the stray capacitances from the storing means when measuring each voltage of the blocks, thereby calculating the erroneous voltage; and subtracting a calculated value of the erroneous voltage from a measured value of a terminal voltage of the measuring output terminal, thereby calculating a true value of a measured voltage of each of the blocks.

3. A voltage measurement device, in a plurality of voltage sources in series connection that are divided into a plurality of blocks each having at least one voltage source, for measuring respective voltages of the blocks, the voltage measurement device comprising:

a measuring capacitive element connected to the blocks;

a first group of switches each arranged between the blocks and the measuring capacitive element to connect the voltages of the blocks to the measuring capacitive element;

a measuring output terminal connected to the measuring capacitive element;

a second group of switches each arranged between the measuring capacitive element and the measuring output terminal to connect the voltage of the blocks accumulated in the measuring capacitive element to the measuring output terminal;

calculating means connected to the measuring output terminal; and storing means connected to the calculating means, wherein the calculating means is adapted so as to perform the operations of:

measuring known voltages of the blocks thereby calculating an erroneous voltage due to electrical charges accumulated in a stray capacitance including parasitic capacitances of the second group of switches;

allowing the storing means to store a calculated value of the erroneous voltage;

subtracting the calculated value of the erroneous voltage stored in the storing means from a measured value of a terminal voltage of the measuring output terminal when measuring each voltage of the blocks, thereby calculating a true value of a measured voltage of each of the blocks.

4. The voltage measurement device as claimed in any one of claims 1 to 3, further comprising means for sampling a terminal voltage of the measuring output terminal when a predetermined time has passed since the second group of switches were turned on and further outputting the so-sampled terminal voltage to the calculating means, as a measured value.

5. The voltage measurement device as claimed in any one of claims 1 to 3, wherein the calculating means calculates the erroneous voltage from a prepared graph showing a relationship between a bias voltage, which corresponds to a voltage of each of the blocks, and the stray capacitance of the second group of switches.

* * * * *